(12) United States Patent
Arell et al.

(10) Patent No.: US 6,753,734 B2
(45) Date of Patent: Jun. 22, 2004

(54) MULTI-MODE AMPLIFIER BIAS CIRCUIT

(75) Inventors: Thomas W. Arell, Basking Ridge, NJ (US); Henry Z. Liwinski, North Wales, PA (US)

(73) Assignee: Anadigics, Inc., Warren, NJ (US)

( * ) Notice: Subject to any disclaimer, the term of this patent is extended or adjusted under 35 U.S.C. 154(b) by 65 days.

(21) Appl. No.: 10/358,371

(22) Filed: Feb. 4, 2003

(65) Prior Publication Data

US 2003/0146790 A1 Aug. 7, 2003

Related U.S. Application Data

(63) Continuation-in-part of application No. 09/875,117, filed on Jun. 6, 2001, now Pat. No. 6,515,546.

(51) Int. Cl.[7] ............................. H03F 3/04; H03F 1/14
(52) U.S. Cl. ......................... 330/296; 330/51; 330/288
(58) Field of Search ......................... 330/296, 51, 288, 330/261, 291

(56) References Cited

U.S. PATENT DOCUMENTS

| | | | |
|---|---|---|---|
| 2,663,806 A | 12/1953 | Darlington | 307/88 |
| 3,168,706 A | 2/1965 | Brenig | 330/18 |
| 3,392,342 A | 7/1968 | Ordower | 330/22 |
| 3,491,203 A | 1/1970 | Shabad | 179/1 |
| 3,534,279 A | 10/1970 | Limberg | 330/22 |
| 3,566,289 A | 2/1971 | Cope | 330/19 |
| 3,801,831 A | 4/1974 | Dame | 307/251 |
| 3,855,541 A | 12/1974 | Leidich | 330/22 |
| 3,899,743 A | 8/1975 | Csicsatka | 330/22 |
| RE28,633 E | 11/1975 | Pastoriza | 340/347 |
| 3,936,725 A | 2/1976 | Schneider | 323/1 |
| 3,940,760 A | 2/1976 | Brokaw | 340/347 |
| 3,946,327 A | 3/1976 | Hsu | 330/35 |
| 3,978,473 A | 8/1976 | Pastoriza | 340/347 |
| 3,984,830 A | 10/1976 | Buchanan et al. | 340/347 |
| 4,024,415 A | 5/1977 | Matsuura | 307/362 |
| 4,064,506 A | 12/1977 | Cartwright, Jr. | 340/347 |
| 4,085,411 A * | 4/1978 | Genesi | 396/228 |
| 4,103,246 A | 7/1978 | Limberg | 330/278 |
| 4,117,416 A | 9/1978 | Schade, Jr. | 330/282 |
| 4,117,417 A | 9/1978 | Ahmed | 330/288 |
| 4,119,924 A | 10/1978 | Ahmed | 330/288 |
| RE29,910 E | 2/1979 | Ahmed | 330/51 |
| 4,140,977 A | 2/1979 | Ahmed | 330/288 |
| 4,241,315 A | 12/1980 | Patterson, III et al. | 330/261 |
| 4,329,247 A | 5/1982 | Palmer | 510/244 |
| 4,361,816 A | 11/1982 | Schade, Jr. | 330/288 |
| 4,450,366 A | 5/1984 | Malhi et al. | 327/538 |
| 4,462,005 A | 7/1984 | Kusakabe | 387/750 |
| 4,475,077 A | 10/1984 | Nagano | 323/312 |
| 4,525,682 A | 6/1985 | Lai et al. | 330/288 |
| 4,654,602 A | 3/1987 | Aoki | 330/257 |

(List continued on next page.)

OTHER PUBLICATIONS

Yamamoto, et al., "A 3.2–V Operation Single–Chip Dual–Band AlGaAs/GaAs HBT MMIC Power Amplifier with Active Feedback Circuit Technique" in IEEE Journal of Solid–State Circuits, Aug. 2000, pp. 1109–1120.

*Primary Examiner*—Patricia Nguyen
(74) *Attorney, Agent, or Firm*—Pennie & Edmonds LLP (57) ABSTRACT

There is disclosed a bias circuit exhibiting good stability over variations in temperature and power supply voltage and capable of generating a plurality of discrete levels of output current for biasing RF power amplifier. In accordance with the invention, the bias circuit includes (1) a master transistor connected to the slave transistor in a current-mirror configuration and having two parallel-connected transistor elements, (2) a switch connected to at least one transistor element to control its operation, and (3) a feedback circuit by which the voltage at the collector of the master transistor may be fed back to control the voltages at the bases of the master transistor and the slave transistor. Moreover, the bias circuit can be operated from a power supply voltage that is just above twice the value of the base-emitter voltage of the transistor in the circuit.

47 Claims, 8 Drawing Sheets

U.S. PATENT DOCUMENTS

| | | | |
|---|---|---|---|
| 4,857,864 A | 8/1989 | Tanaka et al. | 330/288 |
| 4,897,614 A | 1/1990 | Nishio | 330/257 |
| 4,990,864 A | 2/1991 | Kwan | 330/288 |
| 5,079,518 A | 1/1992 | Wakayama | 330/288 |
| 5,283,537 A | 2/1994 | Nakamura | 330/288 |
| 5,307,023 A | 4/1994 | Schade, Jr. | 330/257 |
| 5,398,004 A | 3/1995 | Kobayashi | 330/293 |
| 5,404,585 A | 4/1995 | Vimpari et al. | 455/115 |
| 5,412,336 A | 5/1995 | Barrett, Jr. et al. | 327/560 |
| 5,444,361 A | 8/1995 | Ryat | 323/312 |
| 5,451,908 A | 9/1995 | Böhme | 330/300 |
| 5,548,248 A | 8/1996 | Wang | 330/288 |
| 5,619,160 A | 4/1997 | Sirito-Olivier et al. | 327/530 |
| 5,629,648 A | 5/1997 | Pratt | 330/289 |
| 5,675,611 A | 10/1997 | Lehtinen et al. | 375/297 |
| 5,680,112 A | 10/1997 | Xydis | 340/636 |
| 5,724,004 A | 3/1998 | Reif et al. | 330/277 |
| 5,745,016 A | 4/1998 | Salminen | 333/17.1 |
| 5,752,172 A | 5/1998 | Matero | 455/127 |
| 5,805,015 A | 9/1998 | Bruccoleri et al. | 327/538 |
| 5,819,165 A | 10/1998 | Hulkko et al. | 455/126 |
| 5,831,473 A | 11/1998 | Ishii | 327/530 |
| 5,844,443 A | 12/1998 | Wong | 330/275 |
| 5,883,542 A | 3/1999 | Eriksson | 327/483 |
| 5,884,149 A | 3/1999 | Jaakola | 455/103 |
| 5,966,648 A | 10/1999 | Ortberg et al. | 45/347 |
| 5,986,507 A | 11/1999 | Itakura et al. | 330/288 |
| 5,986,509 A | 11/1999 | Lohninger | 330/290 |
| 6,002,922 A | 12/1999 | Schwent | 455/115 |
| 6,011,439 A | 1/2000 | Colarossi et al. | 330/290 |
| 6,018,646 A | 1/2000 | Myllymaki et al. | 455/115 |
| 6,043,714 A | 3/2000 | Yamamoto et al. | 330/296 |
| 6,052,029 A | 4/2000 | Uda et al. | 330/277 |
| 6,052,032 A | 4/2000 | Järvinen | 330/289 |
| 6,118,409 A | 9/2000 | Pietsch et al. | 347/703 |
| 6,122,532 A | 9/2000 | Taylor | 455/547 |
| 6,181,206 B1 | 1/2001 | Palmisano et al. | 330/278 |
| 6,191,656 B1 | 2/2001 | Nadler | 330/288 |
| 6,195,562 B1 | 2/2001 | Pirhonen et al. | 455/553 |
| 6,211,738 B1 | 4/2001 | Hecht | 330/292 |
| 6,218,904 B1 | 4/2001 | Panther | 330/296 |
| 6,218,906 B1 | 4/2001 | Lohninger | 330/311 |
| 6,242,983 B1 | 6/2001 | Shiao | 330/285 |
| 6,289,205 B1 | 9/2001 | Pollanen et al. | 455/126 |
| 6,300,837 B1 | 10/2001 | Sowlati | 330/296 |
| 6,313,705 B1 | 11/2001 | Dening et al. | 330/276 |
| 6,333,677 B1 | 12/2001 | Dening | 330/296 |
| 6,359,516 B1 | 3/2002 | Luo et al. | 330/296 |
| 6,369,656 B2 | 4/2002 | Dening et al. | 330/296 |
| 6,369,657 B2 | 4/2002 | Dening et al. | 330/296 |
| 6,370,358 B2 | 4/2002 | Liimaainen | 455/67.1 |

* cited by examiner

MULTI-MODE AMPLIFIER BIAS CIRCUIT

REFERENCE TO RELATED APPLICATIONS

This application claims the benefit under 35 U.S.C. §120 and is a continuation-in-part of U.S. patent application Ser. No. 09/875,117 filed Jun. 6, 2001, by Henry Z. Liwinski entitled "Bias Circuit For Use With Low-Voltage Power Supply," which is scheduled to issue as U.S. Pat. No. 6,515,546 on Feb. 4, 2003, which is furthermore incorporated by reference herein in its entirety.

FIELD OF THE INVENTION

The present invention relates generally to a circuit for biasing a transistor, and, more particularly, to a circuit that is capable of biasing a transistor into a plurality of output power modes.

BACKGROUND OF THE INVENTION

Modern wireless communications devices, such as cellular telephones, are held to ever-higher performance standards. The devices must support various communication standards, transmissions must be clear and undistorted, and the battery in the devices must be small and have a long life. Such performance standards require high operational versatility from the devices transmitter, and in particular, a power amplifier therein. Generally, power amplifiers comprise a transistor and a bias circuit that generates a direct-current ("DC") bias signal (comprising both a voltage and a current) to be applied to the transistors input terminal to establish its operating point. (The operating point of a transistor may be defined as the point on the transistor's characteristic curves at which the transistor will operate in the absence of an input signal. See, e.g., John Markus, Electronics Dictionary 445 (4th ed. 1979).) Because changes in the DC bias signal affect the operating point of the transistor—which may adversely affect performance of the amplifier—the DC bias signal must be very stable (preferably within 5% to 15%) and unaffected by variations in temperature or in the power supply voltage.

Often power amplifying transistors are required to switch between several operating points, an operation also known as mode control. The mode of a communication device may depend, inter alia, on the signal modulation schemes supported by the communication device or on the desired output power level. In the former case, a constant-envelope modulation scheme may require an operating point that ensures efficient signal amplification, whereas a variable-envelope modulation scheme may require a different operating point that is suitable for linear (i.e., distortion-free) amplification. Often, when the amplitude of an input signal is changed to adjust output power level, the amplifier's operating point may need to be adjusted also to prevent signal distortion (i.e., non-linearity) and to improve efficiency of the amplifier. Such multi-mode power amplifiers require bias circuits that are capable of generating several levels of stable DC bias signal.

Among known bias circuits, current-mirror-based bias circuits provide stability against variations in temperature or the power supply voltage. However, current mirror-based bias circuits typically provide one level of stable DC bias signal, although manual tuning of such a bias level may be possible. Typical current-mirror configuration comprises a master transistor base-coupled to a slave transistor, a transistor that is to be biased. The base of the master transistor is coupled to its collector, thus providing a voltage feedback that stabilizes bias signal provided by the master transistor to the slave transistor. The ratio of the transconductances of the master and slave transistors define magnitude of that bias signal. An example of such current-mirror-based bias circuit for use in RF power amplifiers is disclosed in U.S. patent application Ser. No. 09/875,117 to Liwinski and owned by the assignee of this invention.

Varying the magnitude of DC bias signal generated by the master transistor typically results in increased complexity, size, cost and power requirements of the bias circuit. For instance, introducing resistive elements at the base or collector of the master transistor for adjusting the magnitude of the bias signal by varying impedance of such resistive elements is cumbersome. As expected, such resistive elements consume power, dissipate heat and also require the bias circuit to operate from a power supply voltage that is significantly higher than the amplifier requirements.

U.S. Pat. No. 4,064,506 to Cartwright, Jr. discloses designs for digital-to-analog converters based on the current mirror configuration. The various circuits disclosed or suggested by the current mirror arrangement of Cartwright receive a digital input at the master transistor and results in an analog output at the slave transistor. The current mirror disclosed in Cartwright, Jr. patent includes a master transistor that is a composite transistor that comprises a plurality of transistor elements selectively paralleled via switches. Thus, by selectively enabling or disabling such single transistors, the transcoductance of the master transistor may be changed resulting in changing the magnitude of the output current typically to be a fraction (or a multiple) of a reference current.

The circuits disclosed by Cartwright, Jr., however, do not disclose biasing of an amplifier at more than one level since it is directed to directing the slave transistor to provide a mirror current (the output current) reflecting the input digital signal in a D/A converter. By choosing suitable slave transistors the total mirrored current through them may be added to effect digital-to-analog conversion. Furthermore, the circuits disclosed or suggested by Cartwright, Jr. are suitable for stable operation with power supplies providing a significantly larger voltage than the device voltage or a junction voltage. However, these circuits are not suitable as RF power amplifiers because of the presence of a direct feedback resulting in the voltage fluctuations at the gate of the master transistor transferring to its drain, thereby changing the reference current, and consequently adversely effecting stability of the bias signal. Not surprisingly, the disclosed circuits also lack adequate stability against variations in supply voltage and temperature. Notably, the disclosed circuits of Cartwright are entirely implemented with field effect transistors (FETs) that are not suitable for efficient RF signal amplification due to their limited bandwidth.

The replacement of the FET's used as mirroring transistors with bipolar transistors having characteristics that are more suitable for RF power amplification results in a combination of FETs and BJTs that provides insufficient current gain resulting in instability and/or excessive variation with change in temperature or power supply voltage. Moreover, yet another drawback of such a strategy is the complexity involved in fabrication of two different types of transistors (e.g. BJTs and FETs) on a single integrated circuit.

Providing multiple-level biasing of an RF amplifier, to improve the efficiency of operation, continues to be a challenge due to the need to operate the amplifier from low voltage supplies (typical of mobile devices) while providing stable performance in face of temperature and supply voltage variations.

SUMMARY OF THE INVENTION

The invention disclosed herein overcomes, inter alia, these challenges and teaches high-efficiency operation of a RF amplifier by employing multiple-level biasing while operating from low-voltage supplies with provision for stable performance in face of temperature and supply voltage variations.

In accordance with the invention, a bias circuit is provided for generating a plurality of discrete bias levels for one or more RF power amplifying transistor(s). In a preferred embodiment, the bias circuit includes (1) a composite master transistor, which comprises at least one transistor element connected to the RF power amplifying transistor in a current-mirror configuration, (2) a switch connected to the at least one transistor element to control its operation, and (3) a feedback circuit by which variations in the voltage at the collector of the composite master transistor are used to stabilize the voltages at the bases of the composite master transistor and the slave transistor. In a preferred embodiment of the invention, the feedback circuit comprises an emitter-follower buffering amplifier connected at its emitter to the base of the composite master transistor and at its base to the collector of the composite master transistor.

In another embodiment of the invention, the feedback circuit may further comprise a non-inverting amplifier connected between the collector of the master transistor and the base of the emitter-follower. The non-inverting amplifier enables the bias circuit to operate from a power supply voltage that is just above twice the value of the base-emitter voltage of the transistor in the circuit. Furthermore, the non-inverting amplifier improves stability of the bias circuits against fluctuations in temperature or power supply voltage.

It should be noted that exemplary embodiments of the invention include circuits with switching between slave transistors, in effect providing for composite slave transistors. A switch enables or disables a slave transistor element to modify the composite slave transistor. However, such a design may result in undesirable shunt capacitance for some applications.

In one example embodiment of the invention, the switch comprises a transistor switch, which can be enabled or disabled in response to a control voltage. Advantageously, such a switch may be driven by a signal reflecting a drive level of the RF signal. Thus, mode switching by the RF amplifier may be automatic in response to the modulation scheme employed by a received RF signal and/or the drive level of the input RF signal.

Such a switch may be connected to the base of one of the transistor elements. Alternatively, the switch may be connected to the collector of one of the transistor elements. Yet in another variation, the switch may comprise a push-pull emitter follower among many possible implementations.

The invention also includes a method for generating at least two levels of bias current via the above-described bias circuit to bias a slave transistor into two output power modes: a high-power mode and a low-power mode. In accordance with the method, in the high-power mode, in response to a control signal, the switch disables one of the transistor elements in the composite master transistor. The voltage at the collector of the composite master transistor is transferred via the feedback circuit to establish a bias current into the base terminals of the slave transistors thus setting their operating points suitable for high-power signal amplification. In the low-power mode, the transistor element is enabled resulting in different bias signal at the base of the slave transistors suitable for efficient low-power signal amplification.

In another aspect, the invention teaches a current mirror amplifier (CMA), which comprises: a composite master transistor comprising at least two transistor elements; a composite slave transistor comprising at least two transistor elements; a buffering transistor having a control terminal connected to a current-sink terminal of the master transistor and providing an output connected to control terminals of the composite master transistor and the composite slave transistor and the current-sink terminal of the composite slave transistor; a first switch connected to at least one of the at least two transistor elements of the composite master transistor; and a second switch connected to at least one of the at least two transistor elements of the composite slave transistor.

In another aspect, the invention includes a method for manufacturing the above-described bias circuit. In particular, the method comprises the following steps: fabricating a composite transistor having at least two parallel-connected transistor elements; fabricating at least two resistors respectively connected to the control terminals of the at least two transistor elements; fabricating at least two resistors respectively connected to the current-source terminals of the at least two transistor elements; fabricating a buffering transistor, the buffering transistor being connected as emitter-follower between the current-source and control terminals of the master transistor; and connecting a switch to at least one of the at least two transistor elements. Additionally, the method provides for both monolithic and hybrid circuit fabrications.

DETAILED DESCRIPTION OF THE INVENTION

Figure 1:
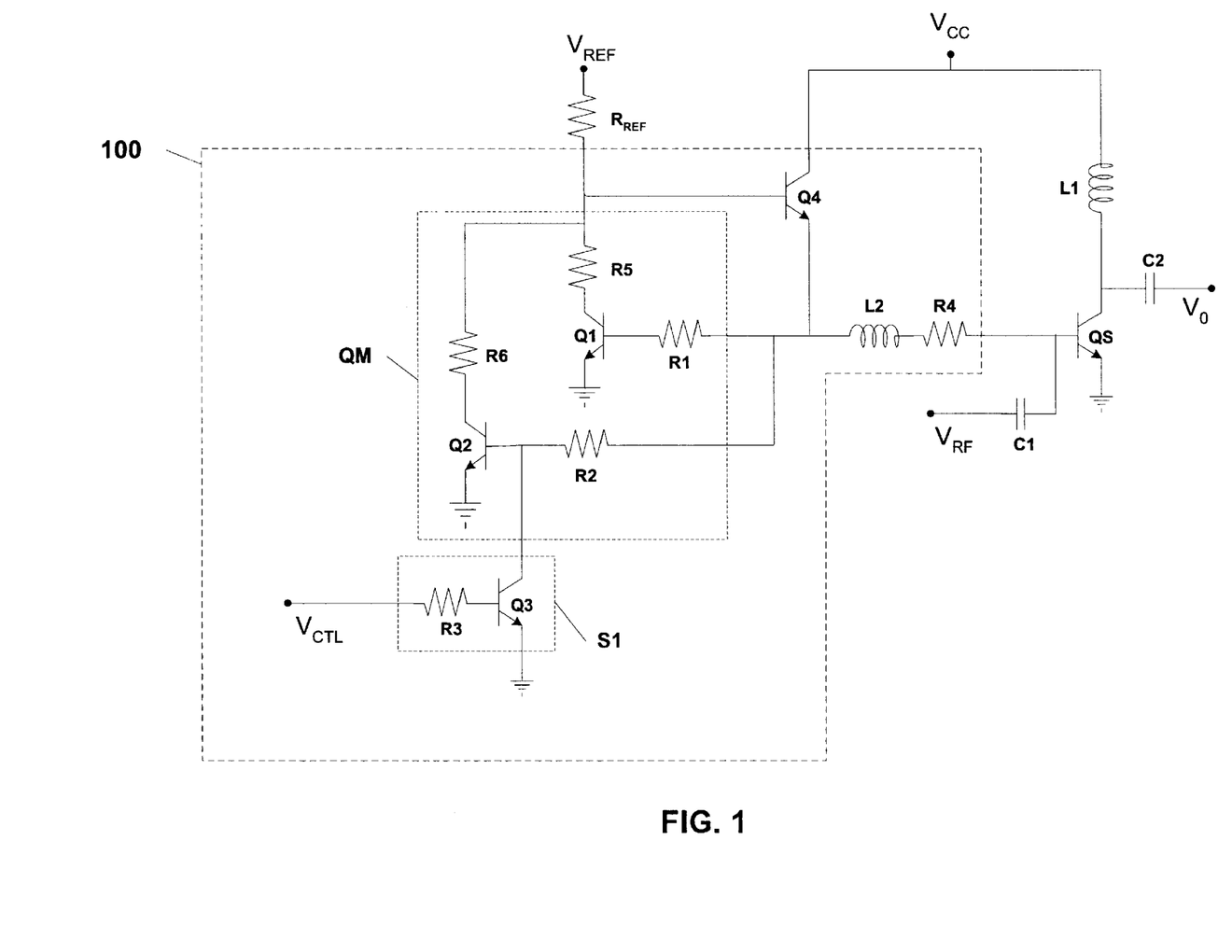
FIG. 1 shows a schematic circuit diagram of a preferred embodiment of a bias circuit in accordance with the invention.

FIG. 1 depicts bias circuit 100 capable of generating two discrete levels of DC bias current for biasing RF slave transistor QS. Bias circuit 100 includes: master transistor QM, shown as a composite transistor, connected to RF slave transistor QS in a current-mirror configuration. It should be noted that the use of a composite master transistor is not a requirement for practicing the invention, but instead represents the use of one or more transistors as part of the implementation of the master transistor. Composite master transistor QM preferably comprises two parallel-connected transistor elements Q1 and Q2. Switch S1, connected to the base of transistor element Q2, enables or disables it in response to a control signal $V_{CTL}$. Feedback circuit 110, connected between the base and collector of composite master transistor QM, senses the voltage at the collector of master transistor QM to stabilize the voltages at the bases of master transistor QM and slave transistor QS.

Composite master transistor QM is connected to slave transistor QS in a current mirror configuration. The base of master transistor QM is coupled to the base terminal of slave transistor QS via optional RF choke L2 and resistor R4. RF choke L2 has large values of inductance to block fluctuations in bias signal that may occur in bias circuit 100 and isolate RF input signal $V_{RF}$ from bias circuit 100. Resistor R2 may be used to further adjust bias level. Furthermore, resistors R4 and R5 may be optionally added to provide yet finer bias level tuning. The collector of master transistor QM is connected via resistor $R_{REF}$ to a power supply establishing reference voltage $V_{REF}$. Reference voltage $V_{REF}$ and resister $R_{REF}$ set value of reference current $I_{REF}$. A typical reference voltage $V_{REF}$ for bias circuit implemented with heterojunction bipolar transistors (HBT) on GaAs substrate is 3.5V and switching reference voltage $V_{REF}$ to 0V disables bias circuit 100 and slave transistor QS.

The collector and base of master transistor QM are connected via feedback circuit 110 comprisnig a buffering transistor Q4. Preferably, buffering transistor Q4 is an emitter-follower having high input impedance and low output impedance. Buffering transistor Q4 improves stability of the reference current by reducing or eliminating the diversion of the input RF signal from the collector of master transistor QM Moreover, buffering transistor Q4 increases gain of the feedback circuit thereby improving its stability to variations in temperature and power supply voltage. Additionally, feedback circuit 110 may comprise a resistor or a voltage divider (not shown) coupled at the emitter of buffering transistor Q4 to further control the amount of bias current supplied to the slave transistor QS.

Figure 8:
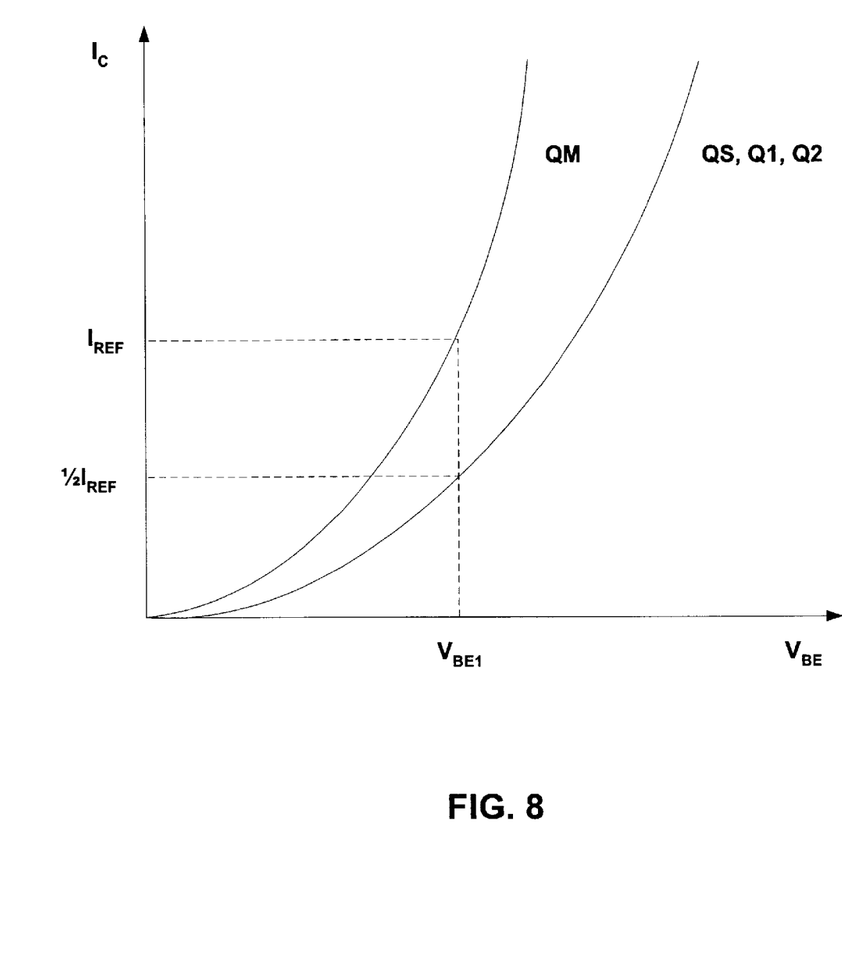
FIG. 8 shows an $I_C$ vs. $V_{BE}$ curve for the master and slave transistors in a preferred embodiment of a bias circuit in accordance with the invention.

In a preferred embodiment, master transistor QM comprises two parallel-connected transistor elements Q1 and Q2 with the base of transistor element Q1 is coupled to the base of transistor element Q2 through resistors R1 and R2 respectively. The collector of transistor element Q1 is coupled to the collector terminal of transistor element Q2 and the emitter of transistor element Q1 is coupled to the emitter of transistor element Q2. Transistor elements Q1 and Q2 are preferably matched to slave transistor QS. In other words, the transistors are fabricated in a similar manner and operated at about the same temperature. Moreover, in a preferred embodiment, areas (i.e., the cross-sectional area and other details for providing current-carrying capacity) of the transistors Q1, Q2 and QS are substantially equal so that their transconductances are also substantially equal. (Alternatively, the areas of transistor elements Q1 and Q2 can be different, but preferably are proportional to each other.) As a result, the area of master transistor QM is twice the area of slave transistor QS when both transistor elements Q1 and Q2 are ON. To this end, the transconductance of master transistor QM is twice the transconductance of slave transistor QS, and therefore, current-carrying capacity of master transistor QM is twice that of slave transistor QS. In other words, as shown in FIG. 8, with transistor elements Q1 and Q2 enabled, master transistor QM sinks twice as much current as slave transistor QS for the same base-emitter voltage $V_{BE}$. Alternatively, with one of the transistor elements is disabled (e.g., transistor element Q2), the area of master transistor QM is equal to the area of slave transistor QS thereby rendering their respective transconductances equal. As a result, at the same base emitter voltage, both master transistor QM and slave transistor QS sink equal amount of current.

Therefore, when both transistor elements Q1 and Q2 are ON, slave transistor QS operates at a first operating point. However, when one of the transistor elements is turned OFF, slave transistor QS operates at a second distinct operation point.

Figure 2:
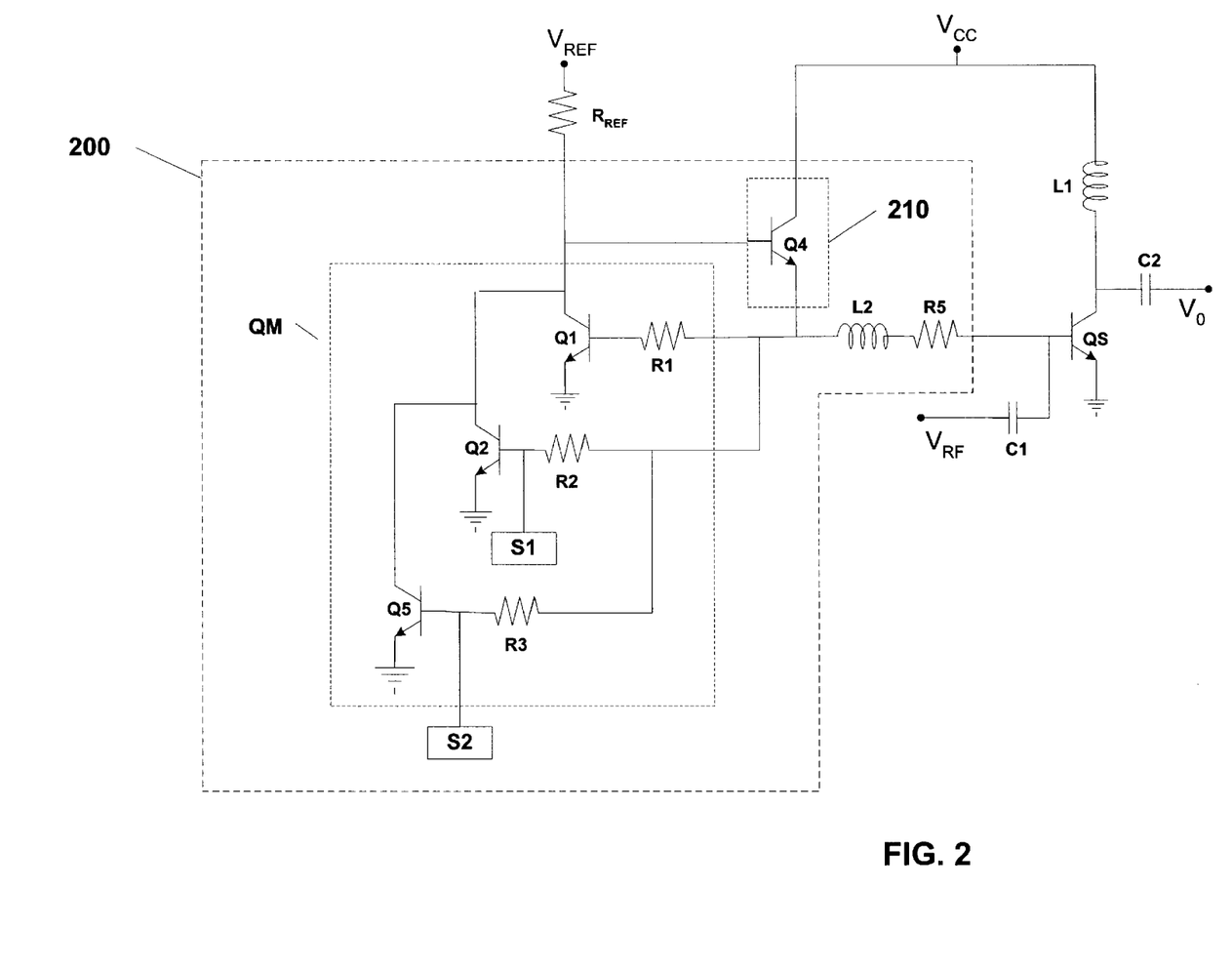
FIG. 2 illustrates a schematic circuit diagram of an exemplary embodiment of a bias circuit in which master transistor comprises more than two transistor elements.

It should be noted that the number of parallel-connected transistor elements may be increased or decreased in accordance with particular design requirements. For instance, FIG. 2 illustrates a circuit with two switches to control master transistor QM having three transistor elements Q1, Q2 and Q3. As a result, the effective area of master transistor QM can be increased or decreased, thereby increasing or decreasing number of different operating points for slave transistor QS. The value of the reference voltage is greater than or about twice the base-emitter voltage of the transistors in the circuit (i.e., junction voltages). Thus, use of additional transistor elements in composite transistors does not require substantial increase in the reference voltage $V_{REF}$. Resistive elements such as R1, R3, R5 and R6 determine appropriate value of the reference voltage with their respective voltage drops being relatively low because resistors R1, R3, R5 and R6 generally have small values.

In accordance with the preferred embodiment, the transistor elements Q1 and Q2 may be enabled and disabled via a switch. In the embodiment shown in FIG. 1, switch S1 preferably comprises transistor switch Q3 connected via its collector to the base of transistor element Q2. In response to the control voltage, $V_{CTL}$, applied to the base of transistor switch Q3, transistor switch Q3 is turned ON and presents a low-impedance termination to ground at the base of transistor element Q2, thereby disabling it. Alternately, the control voltage may turn OFF transistor switch Q3 and switch transistor element Q2 ON.

Figure 4:
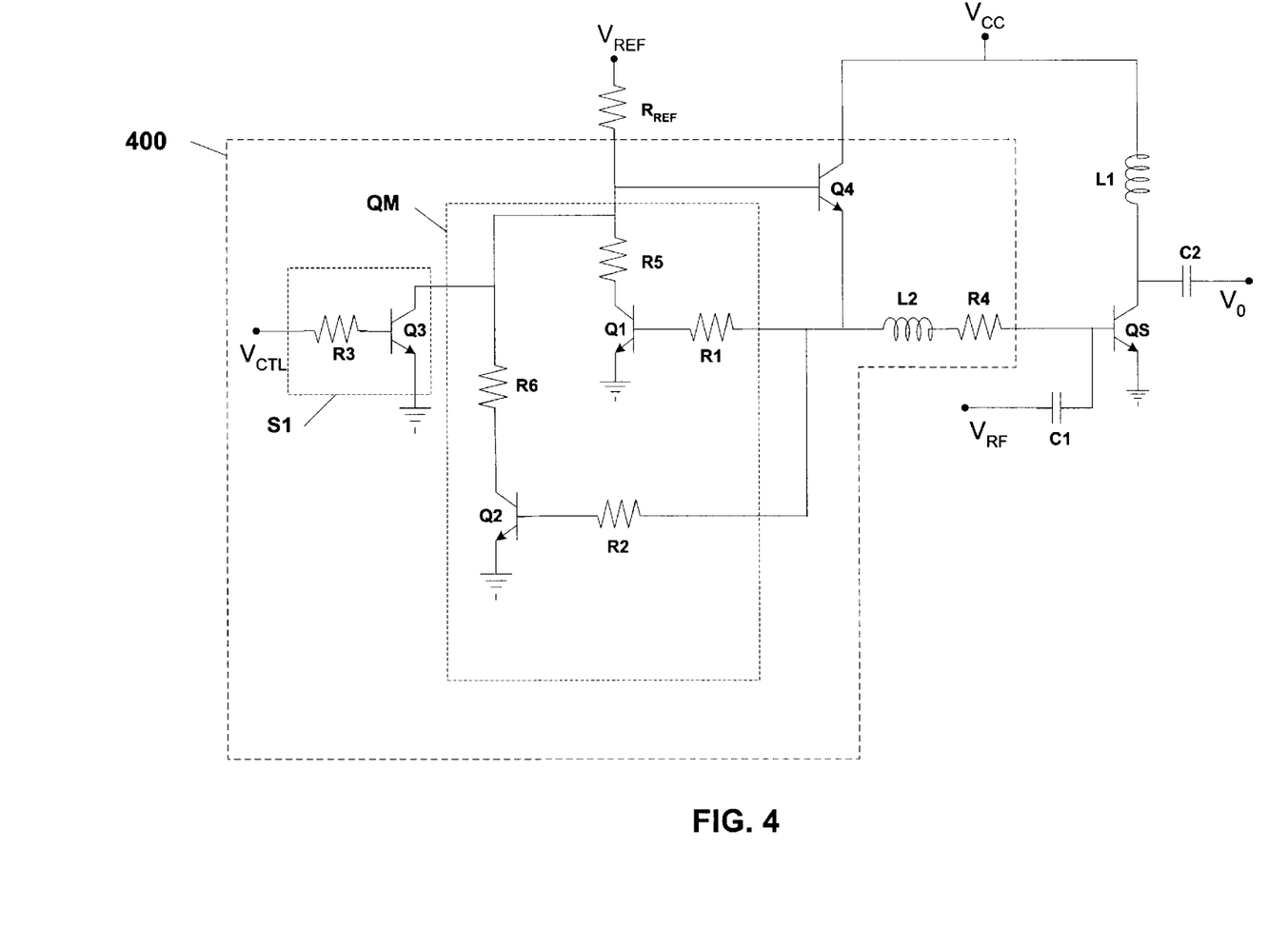
FIG. 4 shows an alternative switching mechanism in accordance with the invention.
Figure 5:
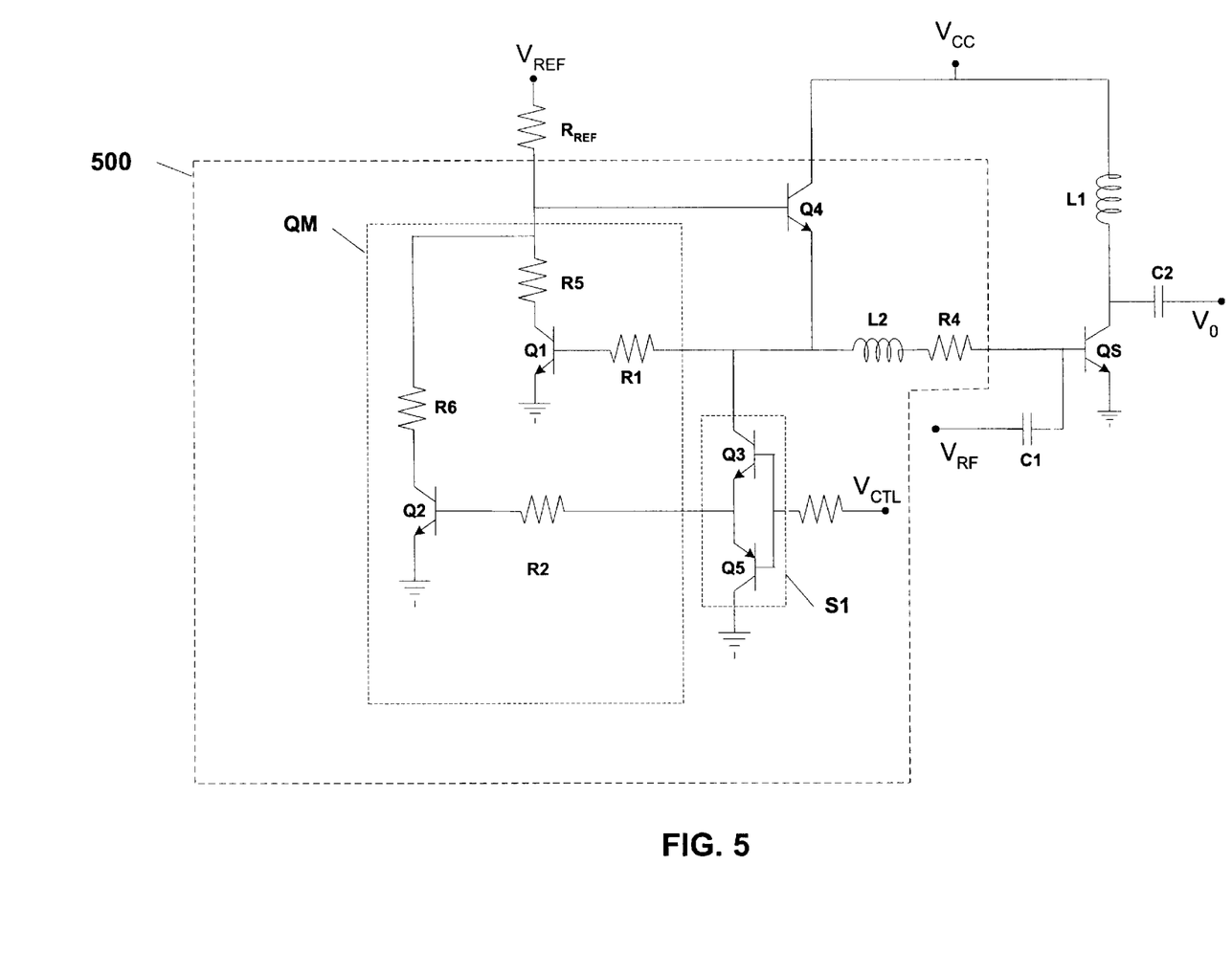
FIG. 5 shows yet another switching mechanism in accordance with the invention

The switching mechanism may be implemented in several ways and the description herein is not intended to be a limitation on the scope of the invention. For example, in one aspect of the invention shown in FIG. 4, switch S1 comprises switching transistor connected to the collector of transistor element Q2. In another aspect, shown in FIG. 5, switch S1 comprises a push-pull emitter follower. Preferably, switch S1 is implemented via HBTs and the entire biasing circuit fabricated using a single transistor type on the same integrated circuit. It should also be noted that switches introduce their own losses. However, it is possible to employ switches that exhibit high efficiencies by controlling the phase difference between the current and the voltage at the switch. Although such, low loss switches require more complex designs, they may be employed in alternative embodiments of the invention.

Figure 6:
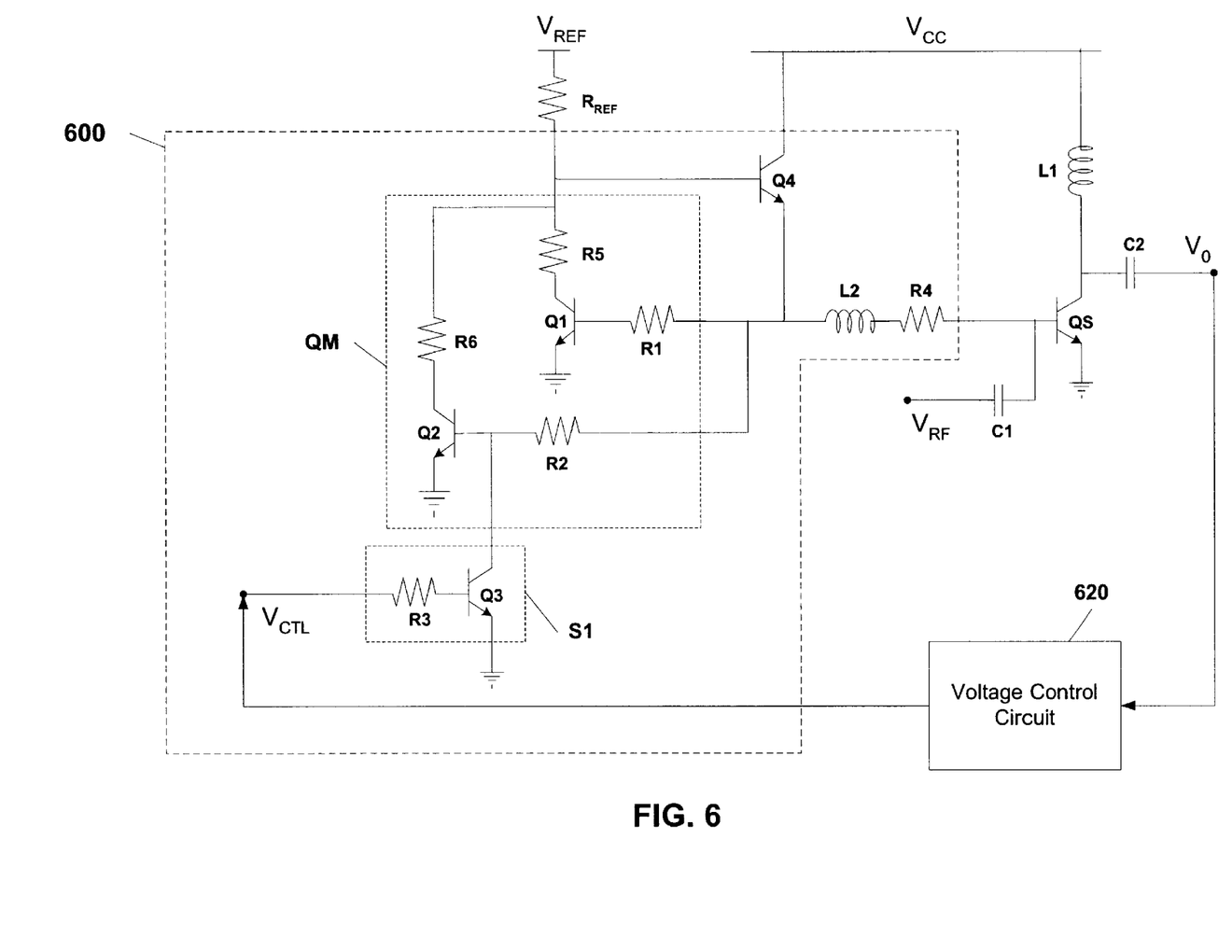
FIG. 6 illustrates a voltage control mechanism in accordance with a preferred embodiment of the invention.

Switch S1 is turned ON or OFF in response to the control signal, $V_{CTL}$. In FIG. 6, a voltage control mechanism is described. The control signal is preferably automatically adjusted in response to the amplitude or modulation scheme change in the output signal $V_O$. In particular, a control circuit 620 is provided to analyze the output signal characteristics and to adjust control signal $V_{CTL}$ accordingly. For example, if an increase in a magnitude of the output signal or a change in the signal modulation scheme is detected, control circuit 620 automatically adjusts value of control signal $V_{CTL}$ to set proper operating point of the RF amplifying transistor. Any method for detecting the drive level or the modulation scheme may be used to implement control circuit 620.

Slave transistor QS is an RF amplifying transistor. It is preferably a heterojunction bipolar transistor (HBT) fabricated on InGaP/GaAs or AlGaAs/GaAs substrate. Slave transistor QS has a collector, an emitter and a base electrodes, which are respectively referred to in the appended claims as current-source, current-sink, and control terminals. An RF input signal $V_{RF}$ is coupled to the base of slave transistor QS via a blocking capacitor C1, which blocks DC signals while allowing input RF signals through. Slave transistor QS amplifies RF input signal $V_{RF}$. The resulting amplified RF signal $V_o$ is outputted at its collector terminal via blocking capacitor C2. The collector terminal of slave transistor QS is coupled to the supply voltage, $V_{CC}$, via RF choke L1, which has a large value of inductance to block voltage fluctuations in the power supply voltage, while the emitter of slave transistor QS is connected to ground.

RF slave transistor QS is preferably capable of linear signal amplification in both high and low output power modes. Such linear operation is required by the digital signal modulation schemes, such as binary phase shift keying (BPSK) or quadrature phase shift keying (QPSK), which are typically used in personal wireless communication devices. In these modulation schemes the envelope of the received signal fluctuates when its phase-shifts; therefore, highly linear (i.e., distortion-free) amplification of such signal is desired. At the same time, RF power amplifiers need to be efficient to preserve battery power. To meet both of these requirements bias circuit 100 preferably biases RF slave transistor QS to operate in a variety of power modes. For example, in the high-power mode, bias circuit 100 preferably sets the operating point of slave transistor QS in its linear region of operation corresponding to class A or class AB or even class B operation. In the low power mode, when the amplitude of the input RF signal is decreased, bias circuit 100 preferably switches to an alternative DC bias level to adjust the operating point of slave transistor QS, thereby maintaining its linear operation while reducing amplifier's power consumption by operating in class AB or close to class B.

Alternatively, bias circuit 100 may bias RF power amplifying transistor QS to operate non-linearly. In various applications it may be necessary for RF power amplifying transistor to amplify both variable and constant envelope signals. In such applications, bias circuit 100 may provide two bias levels suitable for biasing RF power amplifying transistor QS for linear and non-linear operations. In the non-linear mode, slave transistor QS may be biased, for instance, as a class C amplifier. In the linear mode, transistor QS may be biased to operate as a class A, a class AB, or a class B amplifier, each of which are characterized by more linear but less efficient operations than a class C amplifier configuration.

Figure 3:
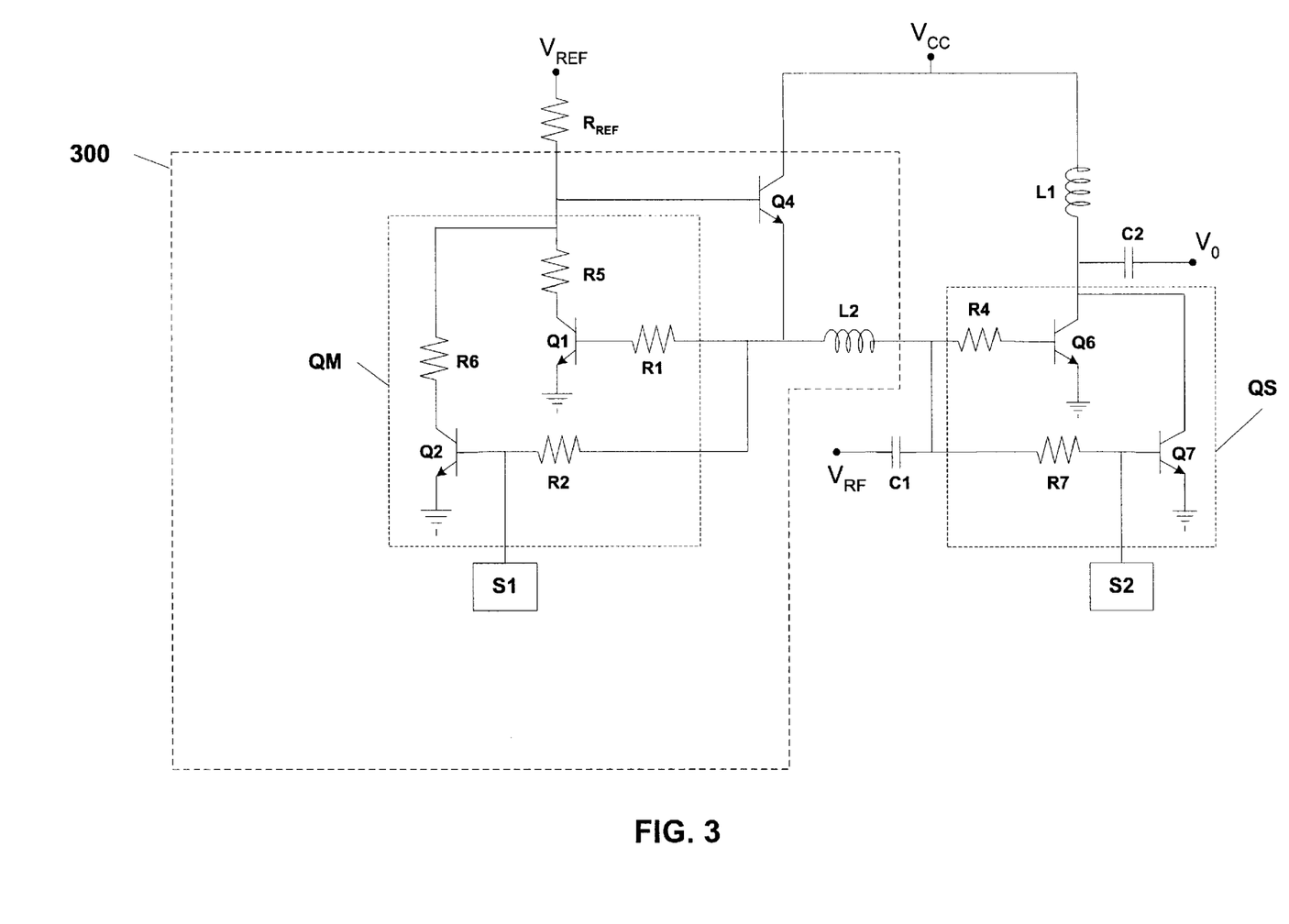
FIG. 3 illustrates an exemplary embodiment of the invention in which slave transistor is a composite transistor.

In an alternative exemplary embodiment of the invention, shown in FIG. 3, slave transistor QS is implemented as a composite transistor. In accordance with the invention, slave transistor QS may comprise transistor elements Q6 and Q7. Switch S2, connected to the base of transistor Q7 enables or disables it in response to a control signal, thereby effectively varying bias level. Such a configuration provides even greater flexibility in generating multiples and fractions of reference signal $I_{REF}$ for biasing a slave transistor. However, such a design may result in undesirable shunt capacitance if one of the transistor elements is disabled.

With reference to FIG. 1, the overall operation of biasing circuit 100 will now be described. The function of biasing circuit 100 is to provide two levels of bias signal to RF amplifying transistor QS so that it operates efficiently and without distortion in each of the "high-power mode" and the "low-power mode." In the high-power mode, an input RF signal $V_{RF}$ having a first predetermined amplitude (relatively high) is applied to the base terminal of RF amplifying transistor QS. A control signal, $V_{CTL}$, is applied to the base of switching transistor Q3 via resistor R3, saturates it and effectively establishes a low-impedance connection to ground at the base of transistor element Q2. Transistor element Q2 is placed into cutoff, i.e., disabled. Since transistor element Q2 is disabled, master transistor QM and slave transistor QS have equal areas (i.e., transconductances), resulting in similar currents flowing into their respective bases. As a result, slave transistor QS is biased at a first operating point, at which it sinks in its collector a current substantially equal to the reference current.

In the low-power mode, an input RF signal $V_{RF}$ having a second predetermined amplitude, which is smaller then the first predetermined amplitude, is applied to the base of RF amplifying transistor QS. The control signal of about 0V is applied to the base of switching transistor Q3 via resistor R3. Transistor element Q2 is saturated, i.e., enabled in parallel to transistor element Q1. Since both transistor element are enabled, effective area of master transistor QM is twice as large as the area of slave transistor QS. Therefore transconductance of master transistor QM is about twice as large as transconductance of slave transistor QS, which enables master transistor QM to have a larger current-carrying capacity than slave transistor QS. As a result, the base current of slave transistor QS is about half the base current of the master transistor QM. This base current biases slave transistor QS at a second operating point, which is different from the first operating point. At this operating point, slave transistor QS sinks into its collector a current about half the reference current.

Figure 7:
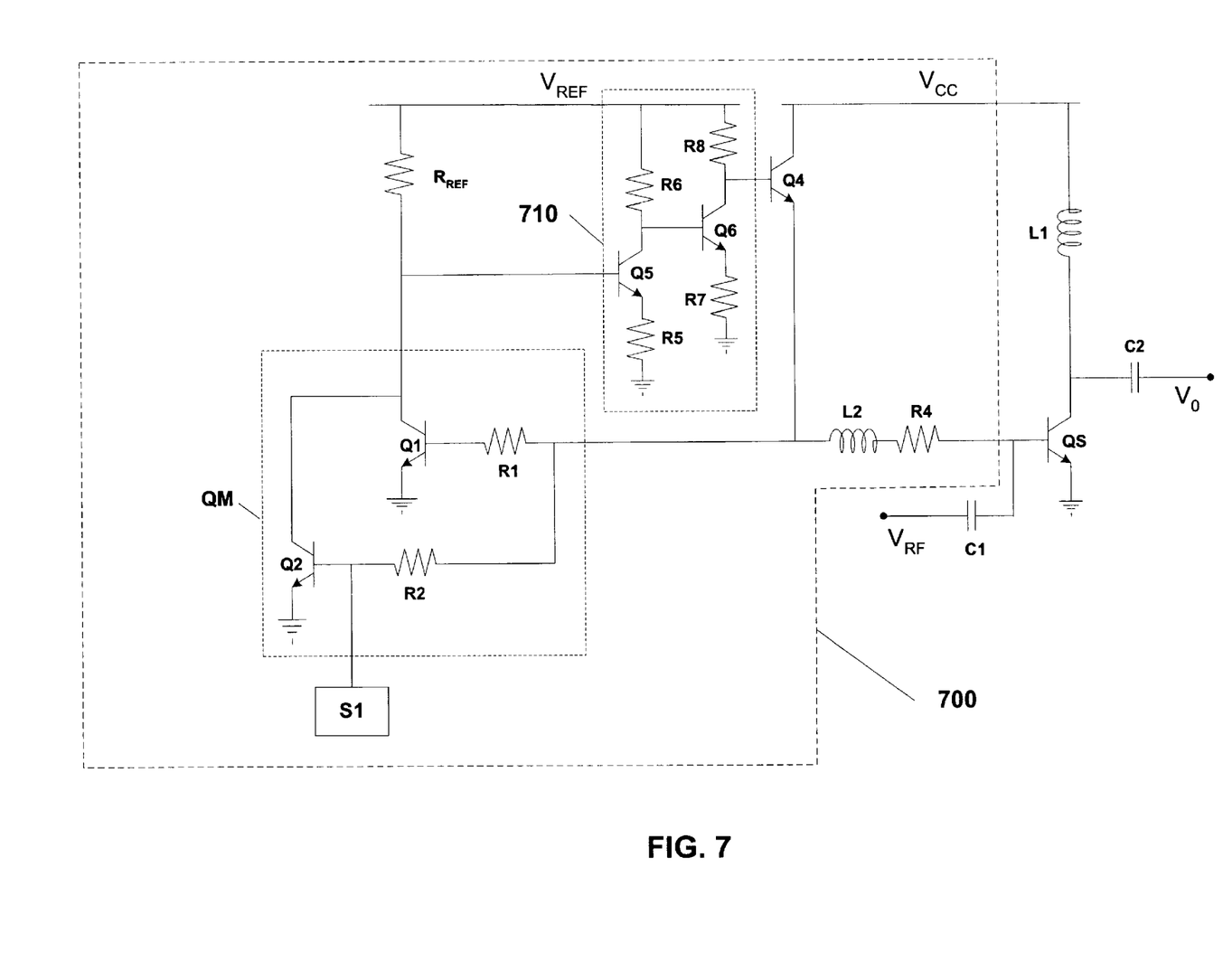
FIG. 7 shows a schematic circuit diagram of another embodiment of a bias circuit having a non-inverting amplifier.

To enable bias circuit 700 to effectively operate from a power supply voltage that is just above twice the value of the junction voltage, the feedback circuit may further comprises non-inverting amplifier 710. The operation and additional benefits of non-inverting amplifier 710 are described in detail in U.S. patent application Ser. No. 09/875,117 filed on Jun. 6, 2001, and scheduled to issue as U.S. Pat. No. 6,515,546 on Feb. 4, 2003. Non-inverting amplifier 710 is preferably connected between the collector terminal of master transistor QM and the base terminal of feedback transistor Q4. Non-inverting amplifier 710 preferably comprises transistors Q5 and Q6 with resistors R5, R6, R7, and R8, the resistances of which are selected to provide appropriate bias currents and transistor gains. Transistors Q5 and Q6 are preferably of the same type (i.e., HBT) and fabricated on the same chip as the rest of the bias circuit. For a bias circuit implemented via HBTs fabricated on a InGaP/GaAs or AlGaAs/GaAs substrate (which have a base-emitter voltage of about 1.33V), non-inverting amplifier 710 enables bias circuit 700 to operate from a power supply voltage $V_{REF}$ of about 2.7V.

Non-inverting amplifier 710 operates in the following manner. As described above, reference voltage $V_{REF}$ establishes via resistor $R_{REF}$ reference current $I_{REF}$ passing through master transistor QM and also a current $I_B$ passing into the base of transistor Q5. If reference voltage $V_{REF}$ increases, both the voltage at the base of transistor Q5 and the current $I_B$ correspondingly increase. The collector-emitter current $I_C$ through transistor Q5 therefore increases, while the collector-emitter voltage of transistor Q5 decreases, pulling down the voltage at the base of transistor Q6 and amplifying the fluctuation in voltage $V_{RFF}$. The decreased voltage at the base of transistor Q6 causes its collector-emitter voltage to increase, thus pulling up the voltage at the base of buffer transistor Q4. The collector-emitter voltage of transistor Q4 correspondingly decreases, thus pulling up its emitter voltage. The current into the base of transistor QM in turn increases, causing the collector-emitter voltage of transistor QM to decrease and thereby pulling down the voltage at its collector back to the desired value.

The biasing circuit of the present invention provides several discrete levels of bias current to an RF power amplifier while exhibiting good stability over variations in temperature and power supply voltage. Moreover, it can be operated from a power supply voltage that is just above twice the value of the base-emitter voltage of the transistor in the circuit. The bias circuit can also be easily integrated, along with other components of the power amplifier on a single monolithic chip through the conventional MMIC (Monolithic Microwave Integrated Circuit) processes. Alternatively, the bias circuit may be implemented as a hybrid circuit having one or more discrete electric components. Notably, the discrete bias circuit may be implemented using any type of transistor, including BJTs, FETs, MESFETs, MOSFETs, HFETs, HBTs, HEMTs, and PHEMTs.

It is understood that the embodiments described herein are merely illustrative and are not intended to limit the scope of the invention. Persons of ordinary skill in the art may make various changes, rearrangements and modifications to the illustrative embodiments described above without departing from the principles of the invention. The invention is defined solely by the following claims.

What is claimed is:

1. A circuit for biasing an RF amplifying transistor, the circuit comprising:
   A. a composite master transistor connected to the RF amplifying transistor in a current-mirror configuration, the composite master transistor comprising at least two transistor elements;
   B. a buffering transistor having a control terminal connected to a current-sink terminal of the master transistor and providing an output connected to control terminals of the composite master transistor and the RF amplifying transistor and the current-sink terminal of the RF amplifying transistor; and
   C. a switch connected to at least one of the at least two transistor elements, wherein in a first state, the switch disables one of the at least two transistor elements, thereby rendering the composite master transistor suitable to bias the RF amplifying transistor at a first operating point, and in a second state, the switch enables one of said at least two transistor elements, thereby rendering the master transistor suitable to bias the RF amplifying transistor at a second operating point.

2. The circuit of claim 1, wherein the slave transistor is a composite transistor comprising at least two transistor elements.

3. The circuit of claim 2, wherein the switch is connected to at least one of the at least two transistor elements of the composite slave transistor.

4. The circuit of claim 1 further comprising at least one resistors connected between the control terminal of the at least one of the at least two transistor elements and a current-source terminal of the buffering transistor.

5. The circuit of claim 1, further comprising at least one resistor connected between the current-sink terminal of the at least one of the at least two transistor elements and the control terminal of the buffering transistor.

6. The circuit of claim 1, wherein the switch comprises a transistor switch.

7. The circuit of claim 6, wherein the switch is coupled to the control terminal of the at least one of the at least two transistor elements.

8. The circuit of claim 6, wherein the switch is coupled to the current-sink terminal of one of the at least two transistor elements.

9. The circuit of claim 1, wherein the switch comprises a push-pull emitter-follower coupled to the control terminal of one of the at least two transistor elements.

10. The circuit of claim 1, wherein the switch operates automatically in response to a control signal.

11. The circuit of claim 1, wherein the switch operates in response to a change in a one of a modulation scheme and a drive level of an input RF signal.

12. The circuit of claim 1, wherein all transistor elements have equal areas.

13. The circuit of claim 1, wherein all transistor elements have different areas.

14. The circuit of claim 1, wherein all transistor elements are matched.

15. The circuit of claim 1, wherein the master transistor has the equal size area to the RF amplifying transistor's area.

16. The circuit of claim 1, wherein the composite master transistor has a different size area from the RF amplifying transistor.

17. The circuit of claim 1, wherein the area of the master transistor is a multiple of the area of the RF amplifying transistor.

18. The circuit of claim 1, wherein the master transistor is matched to the RF amplifying transistor.

19. The circuit of claim 1 further comprising a non-inverting amplifier connected between the current-sink terminal of the composite master transistor and the control terminal of the buffering transistor.

20. The circuit of claim 19, wherein the non-inverting amplifier comprises two cascaded transistors.

21. The circuit of claim 20, wherein the circuit can operate from a power supply that produces a voltage that is about twice base-emitter voltage of the RF amplifying transistor.

22. The circuit of claim 1, wherein all the transistors are implemented as one of BJTs, FETs, MESFETs, MOSFETs, HFETs, HBTs, HEMTs, and PHEMTs.

23. A current mirror amplifier (CMA) comprises:
   A. a composite master transistor, the composite master transistor comprising at least two transistor elements;
   B. a composite slave transistor, the composite slave transistor comprising at least two transistor elements;
   C. a buffering transistor having a control terminal connected to a current-sink terminal of the master transistor and providing an output connected to control terminals of the composite master transistor and the composite slave transistor and the current-sink terminal of the composite slave transistor;
   D. a first switch connected to at least one of the at least two transistor elements of the composite master transistor; and
   E. a second switch connected to at least one of the at least two transistor elements of the composite slave transistor.

24. The CMA of claim 23, wherein the slave transistor is a RF amplifying transistor.

25. The CMA of claim 23 further comprising at least one resistors connected between the control terminal of the at least one of the at least two transistor elements and a current-source terminal of the buffering transistor.

26. The CMA of claim 23, wherein the first switch and the second switch operate automatically in response to a control signal.

27. The CMA of claim 23, wherein the first switch and the second switch operate in response to a change in a one of a modulation scheme and a drive level of an input RF signal.

28. The CMA of claim 23, wherein all transistor elements have equal areas.

29. The CMA of claim 23, wherein all transistor elements have different areas.

30. The CMA of claim 23, wherein all transistor elements are matched.

31. The CMA of claim 23, wherein the master transistor has the equal size area to the RF amplifying transistor's area.

32. The CMA of claim 23, wherein the master transistor has a different size area from the RF amplifying transistor.

33. The CMA of claim 23, wherein the area of the master transistor is a multiple of the area of the RF amplifying transistor.

34. The CMA of claim 23, wherein the master transistor is matched to the RF amplifying transistor.

35. The CMA of claim 23 further comprising a non-inverting amplifier connected between the current-source terminal of the composite master transistor and the control terminal of the buffering transistor.

36. The CMA of claim 35, wherein the non-inverting amplifier comprises two cascaded transistors.

37. The CMA of claim 36, wherein the circuit can operate from a power supply that produces a voltage that is about twice base-emitter voltage of the RF amplifying transistor.

38. The CMA of claim 23, wherein the transistors in the circuit are implemented as one of BJTs, FETs, MESFETs, MOSFETs, HFETs, HBTs, HEMTs, and PHEMTs.

39. A method of biasing an RF amplifying transistor having at least two operating points via a bias circuit comprising a composite master transistor connected to the RF amplifying transistor in a current-mirror configuration and comprising at least two transistor elements, the method comprising the steps of:

A. providing a path for a reference current through a current-sink terminal of the composite master transistor; and B. providing one of the at least two transistor elements to generate a first bias signal; and C. providing another of the at least two transistor elements to generate a second bias signal, wherein second bias signal is different from the first bias signal.

40. The method of claim 39, wherein the first bias signal is a fraction of the reference current.

41. The method of claim 39, wherein the second bias signal is a fraction of the reference current.

42. The method of claim 39 further comprising the step of applying an RF signal to the base of the RF amplifying transistor.

43. A method for manufacturing a bias circuit comprising the steps of:

A. fabricating a composite transistor having at least two parallel-connected transistor elements;

B. fabricating a buffering transistor, the buffering transistor being connected as emitter-follower between the current-source and control terminals of the composite transistor; and C. connecting a switch to at least one of the at least two transistor elements.

44. The method of claim 43 further comprising the step of fabricating at least two resistors respectively connected to the control terminals of the at least two transistor elements.

45. The method of claim 43 further comprising the step of fabricating at least two resistors respectively connected to the current-source terminals of the at least two transistor elements.

46. The method of claim 43, wherein the composite transistor, the buffering transistor and the switch are fabricated on a monolithic circuit.

47. The method of claim 43, wherein the composite transistor, the buffering transistor and the switch are fabricated on a hybrid circuit.

* * * * *